United States Patent [19]

Plies

[11] Patent Number: 4,629,899
[45] Date of Patent: Dec. 16, 1986

[54] DEFLECTION LENS SYSTEM FOR GENERATING A BEAM OF NEUTRAL PARTICLES OF VARIABLE CROSS SECTION

[75] Inventor: Erich Plies, Munich, Fed. Rep. of Germany

[73] Assignee: Siemens Aktiengesellschaft, Berlin and Munich, Fed. Rep. of Germany

[21] Appl. No.: 817,167

[22] Filed: Jan. 8, 1986

Related U.S. Application Data

[63] Continuation of Ser. No. 512,531, Jul. 11, 1982, abandoned.

[30] Foreign Application Priority Data

Sep. 22, 1982 [DE] Fed. Rep. of Germany ....... 3235068

[51] Int. Cl.$^4$ .......................... G21K 1/08; H05H 3/00
[52] U.S. Cl. .............................. 250/396 ML; 250/251
[58] Field of Search ................. 250/251, 396 ML, 307; 313/431, 433, 442, 361

[56] References Cited

U.S. PATENT DOCUMENTS

| | | | |
|---|---|---|---|
| 3,387,241 | 6/1968 | Aldoin et al. ................ | 250/396 ML |
| 3,418,463 | 12/1968 | Lacey ..................................... | 250/251 |
| 3,952,198 | 4/1976 | Harada et al. ................. | 250/396 ML |
| 4,236,073 | 11/1980 | Martin ................................. | 250/309 |
| 4,355,236 | 10/1982 | Hoslinger .................... | 250/396 ML |
| 4,429,229 | 1/1984 | Gluckstern .................. | 250/396 ML |

OTHER PUBLICATIONS

"Emission Characteristics of Gallium and Bismuth Liquid Metal Field Ion Sources," Swanson et al., J. Vac. Sci. Tech., 16(6), Nov./Dec. 1979, pp. 1864–1867.

"High Resolution, Ion Beam Processes for Microstructure Fabrication," Seliger et al., J. Vac. Sci. Tech., 16(6), Nov./Dec. 1979, pp. 1610–1612.

"Quadrupoles in Electron Lens Design," Hawkes, 1970, pp. 3–10, 87–95.

Primary Examiner—Bruce C. Anderson
Assistant Examiner—Paul A. Guss
Attorney, Agent, or Firm—Hill, Van Santen, Steadman & Simpson

[57] ABSTRACT

An apparatus for deflecting and focusing a beam of neutral particles for operating on extremely small workpieces, such as for doping or inscribing micro-electronic components, has a deflection system for generating at least one magnetic field through which the beam of neutral particles is directed for focusing and shaping of the beam on the workpiece. The lens system may include one or more six-pole or eight-pole lenses.

8 Claims, 4 Drawing Figures

DEFLECTION LENS SYSTEM FOR GENERATING A BEAM OF NEUTRAL PARTICLES OF VARIABLE CROSS SECTION

This is a continuation of application Ser. No. 512,531, filed July 11, 1982, now abandoned.

BACKGROUND OF THE INVENTION

1. Field of the Invention

The present invention relates to devices for deflecting and focusing a beam of particles for undertaking a selected operation on a workpiece, and in particular to a method and apparatus for focusing and deflecting a beam of neutral particles employing a beam deflection lens for variably shaping the cross-section of the beam.

2. Description of the Prior Art

The manufacture of increasingly smaller electronic modules and circuits and other components having small structural dimensions requires manufacturing tools capable of accurate positioning within the confines of such small dimensions. For example, integrated micro-electronic semiconductor modules and semiconductor circuits must be structurally doped. In the manufacture of other microstructures, particles must be implanted in or applied to an object workpiece, such as a substrate. Such is necessary, for example, in undertaking surface processing or upgrading wherein, because of the scarcity of raw materials and rising raw material costs, only essential locations on the workpiece are processed or upgraded, such as the location of electrical contacts, rather than indiscriminately applying the raw materials to a much broader area of the surface of the workpiece.

Lithographic methods employing light, electron beams and X rays are conventional means for doping micro-electronic components. Lithography with ion beams, wherein patterns of masks are projected onto lacquer, thereby inscribing the lacquer, is still in its infancy. Research has just begun with directing ion beam implantation inscription into a semiconductor wafer, as described in an article by R. L. Seliger et al, J. Vac. Sci. Tech. 16, 1979, p. 1610. This is because suitable sources with high intensity have only recently become available, such as liquid metal ion sources, see the article by L. W. Swanson et al in the same publication at p. 1864. Due to the coulomb interaction at high beam currents, causing an energy spread and a beam spread, high throughput of microstructures has not been achieved, nor is the accuracy and reliability of the small dimensions of the structures to be generated such as, for example, semiconductor elements, been achieved with conventional electron beam and ion beam inscription.

SUMMARY OF THE INVENTION

It is an object of the present invention to provide a method and apparatus for focusing and directing a particle beam onto a workpiece for inscribing or performing other work on the workpiece involving small structural dimensions.

Another object of the present invention is to provide such a method and apparatus which permits a high throughput of generated structures without sacrifice to the accuracy and reliability of the structure thereby generated.

The above objects are inventively achieved by the use of a beam of neutral particles generated by a suitable neutral beam particle source which is directed through a beam deflection lens for focusing and deflecting the neutral particles onto a workpiece having small structural dimensions. The deflection lens includes means for generating at least one magnetic field for focusing and deflecting the neutral particles.

The method and apparatus disclosed herein permits "neutral particle implantation inscription" for manufacturing integrated microelectronic modules. Because, in their ground level state, most implantation elements exhibit an angular momentum of the electron shell and thus a magnetic dipole moment, those elements can be focused and deflected by magnetic fields. This permits neutral particle implantation inscription having the advantages of requiring fewer process steps than conventional lithographic methods, and wherein the interaction of the beam particles among one another is significantly less than in charged particle beam systems, thereby avoiding a large beam spread and the use of high beam currents.

The beam deflection lens utilized in the system disclosed herein for generating a beam of variable cross-section may consist of two, three or four magnetic six-pole or eight-pole lenses by means of which the beam, according to the alignment of the magnetic dipoles, can be deflected in two perpendicular directions while simultaneously being focused. The imaging of the lens as a whole is stigmatic, and the beam is shaped. The probe shaping is fixed given the employment of a pair of six-pole or eight-pole lenses, is variable in one direction given employment of a trio of six-pole or eight-pole lenses, and is variable in two directions given employment of four six-pole or eight-pole lenses. Because only a single-shaped diaphragm is necessary in the apparatus disclosed herein, improved beam exploitation results in contrast with conventional methods with variable probes wherein two diaphragms are imaged on each other through lenses or by shadow imaging.

In the beam deflection lens disclosed herein, the functions of imaging, deflection and variable shaping of the probe are completely integrated in a single system consisting of four six-pole or eight-pole lenses. The use of six-pole lenses is sufficient, although eight-pole lenses provide finer adjustment as may be needed in some applications.

A suitable neutral particle source, such as a liquid metal ion source, is described, for example, in the aforementioned article by Swanson et al, which may be utilized in combination with a neutralizer.

DESCRIPTION OF THE PREFERRED EMBODIMENTS

Figure 1:
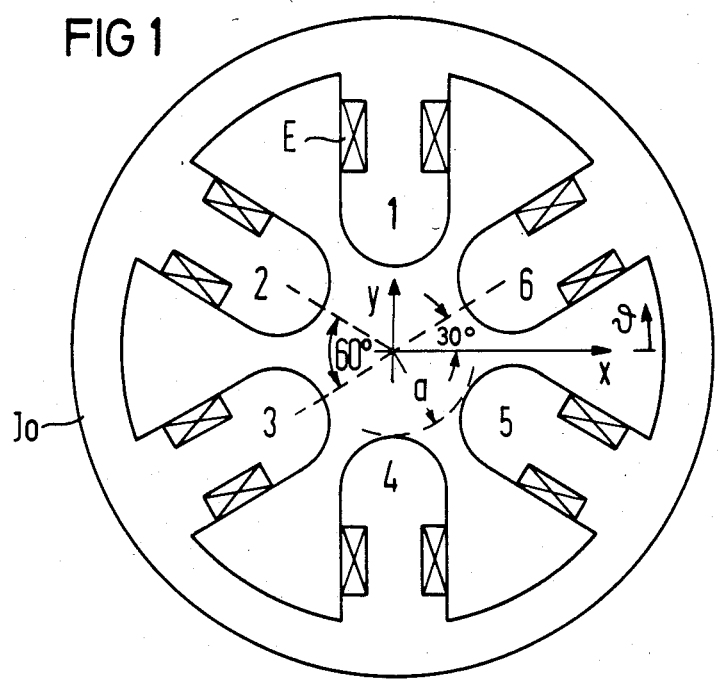
FIG. 1 is a plan view of a six-pole lens of the type which may be utilized in the lens arrangement constructed in accordance with the principles of the present invention.

A beam of neutral atoms or molecules each having a magnetic dipole moment $\vec{m}_D$ is propagatable along the z axis of a Cartesian coordinate system. If a homogeneous magnetic field $\vec{H}$ is applied in the y direction, the torque expressed by the equation:

$$\vec{D} = \vec{m}_D \times \vec{H}. \tag{1}$$

influences each beam particle. It is known from atomic physics that the magnetic dipole moment is a function of the angular momentum of the electron shell $\vec{J}$ according to the equation:

$$\vec{m}_D = -g_J \mu_B \vec{J}/\hbar \tag{2}$$

and that the torque $\vec{D}$ effects precession of $\vec{J}$ and $\vec{m}_D$ around the y-axis. The precessional frequency is defined by the equation:

$$\omega_p = m_D |\vec{H}|/|\vec{J}| = g_J e B/(2 \cdot m_e). \tag{3}$$

In equations (2) and (3), $\mu_B$=magneton; $\hbar = h/2\pi$ (h=Planck's constant), $m_e$=electron rest mass, and $g_J$=Landes' g-factor.

Given such precession, only the y-component of the dipole moment $\vec{m}_D$ remains constant with time. This y-component of the dipole moment $\vec{m}_D$ is related to the magnetic quantum number $M_J$ by the equation:

$$m_{Dy} = -M_J g_J \mu_B \tag{4}$$

wherein the magnetic quantum number $M_J$ may assume a total of $2J+1$ values where J is the total angular momentum quantum number of the electron shell. In order that the y-component of the dipole moment, $m_{Dy}$, is of the same size for all beam particles, all beam particles must exhibit the same magnetic quantum number $M_J$. Other quantum states can be stripped, for example, with a Stern-Gerlach separator.

When the particles are aligned as described above, only the chronologically constant component $m_{Dy}$ of the dipole moment need be considered for the beam deflection and beam focusing, because the transit time $\tau$ is large in comparison to the precessional period $T_P$, according to the relationships:

$$\tau = l/v \gg 2\pi/\omega_p = 4\pi m_e/(g_J \cdot e \cdot B) = T_P, \tag{5}$$

which can be achieved by means of a sufficiently high B-field. In equation (5), l is the beam length and v is the velocity of the beam particles.

The force $\vec{F}$ exerted on magnetic dipole particles in a magnetic field $\vec{H}$ is expressed by the equation:

$$\vec{F} = (\vec{m}_D \overrightarrow{\text{grad}}) \vec{H} = m_D \frac{d\vec{H}}{ds \, \vec{m}_D} \tag{6}$$

requiring the magnetic field $\vec{H}$ to have a gradient for deflecting the dipole particle in the direction of the magnetic dipole moment $\vec{m}_D$. In the simplest case, such a gradient may be selected to be a constant. Quadrupole fields having the following configuration exhibit such a constant field gradient:

$$\left.\begin{array}{l}\psi = \psi_{2c}(z)(x^2-y^2) + 2\psi_{2s}(z) \, x \, y, \\ \vec{B} = \mu_o \vec{H} = -\overrightarrow{\text{grad}} \, \psi = -2(\psi_{2c} x + \psi_{2s} y) \vec{e}_x + \\ 2(\psi_{2c} y - \psi_{2s} x) \vec{e}_y \end{array}\right\} \tag{7}$$

In the above equations constituting (7), $\psi$ is the scalar magnetic potential and $\psi_{2c}(z)$ and $\psi_{2s}(z)$ are field coefficients which are not dependent on x or y.

Using the expression $\vec{m}_D = m_{Dy} \vec{e}_y$, and substituting the magnetic field $\vec{H}$ from equation (7) into equation (6) for the force $\vec{F}$, the following expression for the force $\vec{F}$ derives:

$$\left.\begin{array}{l}\vec{F} = (m_{Dy} \vec{e}_y \overrightarrow{\text{grad}}) \vec{H} = m_{Dy} \frac{\partial \vec{H}}{\partial y} \\ = \frac{2 m_{Dy}}{\mu_o} \{-\psi_{2s} \vec{e}_x + \psi_{2c} \vec{e}_y\}\end{array}\right\} \tag{8}$$

The quadrupole field $\vec{B}$ according to equation (7) causes deflection of neutral particles exhibiting a magnetic moment $\vec{m}_D = m_{Dy} \vec{e}_y$ both in the y-direction and in the x-direction. By superimposing the quadrupole field which causes deflection in the x-direction and the quadrupole field which effects deflection in the y-direction, deflection of the neutral particles, which essentially exhibit only a y-component of the magnetic dipole moment, can be accomplished in any desired direction. The deflection direction having a deflection angle $\theta_A$ is determined by the ratio of the field coefficients $\psi_{2c}/\psi_{2s}$ from equation (7) as follows:

$$\theta_A = \arctan\left(\frac{Y_A}{X_A}\right) = \arctan\frac{\psi_{2c}}{\psi_{2s}}. \tag{9}$$

The magnitude of the deflection coordinate $r_A = \sqrt{x_A^2 + y_A^2}$ is proportional to $\sqrt{\psi_{2c}^2 + \psi_{2s}^2}$. The generation of an azimuthally rotatable quadrupole field which is variable in intensity utilizing a magnetic six-pole or eight-pole lens is described in greater detail below in connection with FIG. 1 and FIG. 2.

Although neutral particles exhibiting a magnetic dipole moment can be focused by means of six-pole magnets, such focusing is generally convergent in only one section and is divergent, i.e., "defocusing" in another section.

Because the magnetic dipole moments of the beam particles in the sample embodiment discussed herein are aligned in the y-direction by the external magnetic field H, the six-pole field for focusing the beam particles should be of the form:

$$\vec{B} = -3\psi_{3s}\{2xy\vec{e}_x + (x^2-y^2)\vec{e}_y\} \tag{10}$$

to which the scalar magnetic potential $$\psi = \psi_{3s}(3x^2y - y^3) \tag{11}$$

is allocated. The following motion equation can then be derived utilizing equation (10):

$$m \left( \frac{d^2x}{dt^2} \vec{e_x} + \frac{d^2y}{dt^2} \vec{e_y} \right) = m_{Dy} \frac{\partial \vec{H}}{\partial y} \quad (12)$$

$$= -6 \frac{m_{Dy}\psi_{3s}}{\mu_o} (x\vec{e_x} - y\vec{e_y})$$

In equation (12), m denotes the mass of a neutral particle, and t designates time. Applying the chain rule for derivatives, t can be eliminated from equation (12) as follows:

$$\frac{d}{dt} = \frac{dz}{dt} \cdot \frac{d}{dz} \approx v \frac{d}{dz}, \quad (12a)$$

wherein v denotes the particle velocity.

The following two orbital equations can then be derived:

$$\left. \begin{array}{l} \dfrac{d^2x}{dz^2} + k\,x = 0, \\[6pt] \dfrac{d^2y}{dz^2} - k\,y = 0, \\[6pt] k = 6 \dfrac{m_{Dy}\,\psi_{3s}}{\mu_o \cdot m \cdot v^2} \end{array} \right\} \quad (13)$$

Analysis of the equations designated (13) shows that when the coefficient $\psi_{3s}$ is greater than zero, focusing occurs along the x-section and diverging or defocusing occurs in the y-section; however, when the coefficient $\psi_{3s}$ is less than zero, defocusing occurs in the x-section and focusing occurs in the y-section.

Additionally, the paraxial orbital equations for a neutral particle exhibiting a magnetic dipole moment designated at (13) exhibit the same shape in a six-pole field as the paraxial orbital equations of a charged particle in a quadrupole field. The paraxial orbital equations of a charged particle in a quadrupole field are described in the text "Quadrupoles in Electron Lens Design," P. W. Hawkes, Academic Press (1970). This means that all laws known from quadrupole optics can be fully transferred for focusing neutral particles in the embodiment disclosed herein.

Stigmatic imaging with neutral particles can be achieved with a pair of six-pole magnets, of which one six-pole magnet has a coefficient $\psi_{3s}$ greater than zero, and the other of which has a coefficient $\psi_{3s}$ less than zero. In such an embodiment, however, the two primary enlargements $V_x$ and $V_y$ are no longer variable without changing the subject-to-lens distance, the image distance, or the distance between the pair of six-pole lenses.

If a trio of six-pole lenses is employed, stigmatic imaging can be achieved and the quotient $V_y/V_x$ of the two primary enlargements can be varied within certain limits by changing the six-pole lens strengths without deteriorating the stigmatic image plane. Utilizing four six-pole lenses, it is possible to separately change the primary enlargements $V_y$ and $V_x$ within certain limits without losing stigmatic imaging in the fixed image plane.

The magnetic induction B necessary for alignment of the neutral particle beam has the relation:

$$B >> \frac{4\pi}{g_J} \cdot \frac{m_e}{el} \cdot \sqrt{\frac{2eU_B}{m}} \quad (14)$$

wherein $U_B$ is the kinetic energy of the neutral particle expressed in volts and m is the mass of the neutral particle. Utilizing arsenic as an example in equation (14), which has an atomic weight of 74.9 and a Lande factor $g_J=2$ (because of ground energy level $^4S_{3/2}$), and assuming a beam length $l=0.2$ m and a voltage $U_B=2$ kV, the magnetic induction B must be significantly greater than 0.3 Gauss, which is relatively easy to achieve.

The equation for computing the maximum possible beam deflection, neglecting the fringe field, is:

$$|y_A| = |M_J|\,g_J\,\mu_B \frac{\hat{\psi}_{2c}l}{\mu_o E_{kin}} (l/2 + L) \quad (15)$$

for the deflection $Y_A$ according to the fundamental calculation. In equation (15), l indicates the path length along which the magnetic induction B influences the neutral particles and L indicates the distance which the neutral particles traverse after influence of the magnetic induction up to the location at which the deflection $y_A$ is measured.

The following exemplary calculation can be undertaken to determine the maximum deflection $y_A$. Assume $\hat{\psi}_{2c}$ is the quadrupole coefficient of a magnetic field B expressed as follows:

$$\vec{B} = 2\hat{\psi}_{2c}\{-x\vec{e_x} + y\vec{e_y}\} \quad (15a)$$

If a value of 20k Gauss is assumed for the fringe field strength at the pole pieces of the magnetic lens, a value of 2 kV is assumed for the kinetic energy of the neutral particles, a value of 4 mm is assumed for the spacing of the pole pieces of the magnetic lens, a value of 200 mm is assumed for the path length of the neutral particles within the influencing range of the magnetic induction, and a value of 500 mm is assumed for L up to the z coordinate of that plane in which the deflection $y_A$ is measured, and further assuming a value 3/2 for the magnetic quantum number $M_J$ and a value of 2 for the Lande factor $g_J$, the deflection $|Y_A|$ is approximately 5 μm. In practice, because of the small raster field of the beam deflection lens, a laser-controlled mechanically movable specimen table is required for the workpiece.

A magnetic six-pole lens which may be employed in a beam lens for varying the beam cross-section is shown in FIG. 1. The magnetic six-pole lens is disposed in the x-y plane and has a yoke Jo with six pole pieces 1 through 6 each having an excitation winding E. The following currents flow in the excitation windings E of the individual pole pieces:

In pole piece 1: $I_{1s} - I_{2c} - I_{3s}$

In pole piece 2: $\dfrac{I_{1s}}{2} + \dfrac{I_{2c}}{2} - \dfrac{\sqrt{3}}{2} I_{2s} + I_{3s}$ In pole piece 3: $-\dfrac{I_{1s}}{2} + \dfrac{I_{2c}}{2} + \dfrac{\sqrt{3}}{2} I_{2s} - I_{3s}$ In pole piece 4: $-I_{1s} - I_{2c} + I_{3s}$ In pole piece 5: $-\frac{I_{1s}}{2} + \frac{I_{2c}}{2} - \frac{\sqrt{3}}{2} I_{2s} - I_{3s}$ In pole piece 6: $\frac{I_{1s}}{2} + \frac{I_{2c}}{2} + \frac{\sqrt{3}}{2} I_{2s} + I_{3s}$ Half the distance between the pole pieces 1 through 6 is referenced a. The azimuthal angle $\theta$ is measured from the positive x-semiaxis proceeding toward the positive y-semiaxis. The winding currents are proportional to the coefficients of the scalar magnetic potential, that is, the winding currents having a specific index are respectively proportional to the coefficient $\psi$ having the same index. The scalar magnetic potential $\psi$ is then of the following form:

$$\psi = \psi_{1s}r\sin v + \psi_{2c}r^2\cos 2v + \psi_{2s}r^2\sin 2v + \psi_{3s}r^3\sin 3v \quad (16)$$
$$= \psi_{1s}y + \psi_{2c}(x^2 - y^2) + 2\psi_{2s}xy + \psi_{3s}(3x^2y - y^3)$$

In the sample embodiment, the magnetic induction and the magnetic field of a magnetic six-pole lens as shown in FIG. 1 are composed of three terms: a dipole field far in the y-direction alignment of the beam particles, a quadrupole field for beam deflection variable in strength and azimuthal position, and an azimuthally fixed six-pole field for beam focusing as derived and specified above:

$$\vec{B} = \mu_0 \vec{H} = -\psi_{1s}\vec{e}_y - $$
$$2\{(\psi_{2c}x + \psi_{2s}y)\vec{e}_x + (\psi_{2s}x - \psi_{2c}y)\vec{e}_y\} - \quad (17)$$
$$3\psi_{3s}\{2xy\vec{e}_x + (x^2 - y^2)\vec{e}_y\}$$

Figure 2:
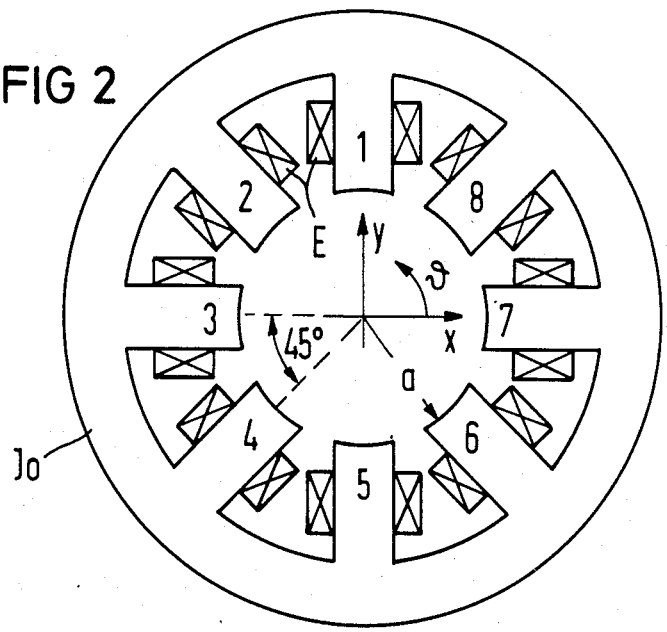
FIG. 2 is a plan view of an eight-pole lens which may be utilized in the lens arrangement constructed in accordance with the principles of the present invention.

A magnetic eight-pole lens which can be employed in the vario-shaped beam deflection lens disclosed herein is shown in FIG. 2. The magnetic eight-pole lens shown in FIG. 2 is again disposed in the x-y plane, and has a yoke Jo and eight pole pieces 1 through 8, each having an excitation winding E. The following winding currents flow into the excitation windings E of the pole pieces 1 through 8:

Given pole piece 1: $I_{1s} - I_{2c} - I_{3s}$

Given pole piece 2: $\frac{I_{1s}}{\sqrt{2}} - I_{2s} + \frac{I_{3s}}{\sqrt{2}}$ Given pole piece 3: $I_{2c}$ Given pole piece 4: $-\frac{I_{1s}}{\sqrt{2}} + I_{2s} - \frac{I_{3s}}{\sqrt{2}}$ Given pole piece 5: $-I_{1s} - I_{2c} + I_{3s}$ Given pole piece 6: $-\frac{I_{1s}}{\sqrt{2}} - I_{2s} - \frac{I_{3s}}{\sqrt{2}}$ Given pole piece 7: $I_{2c}$ Given pole piece 8: $\frac{I_{1s}}{\sqrt{2}} + I_{2s} + \frac{I_{3s}}{\sqrt{2}}$ The winding currents $I_i$ for the windings shown in FIG. 2 have the same relationship to the scalar magnetic potential and to the magnetic induction and to the magnetic field as the corresponding winding currents for the six-pole arrangement shown in FIG. 1.

The component currents proportional to $I_{is}$ generate a dipole field for alignment of the magnetic dipole moment of the beam particles in the y-direction.

The component currents proportional to $I_{2c}$ or $I_{2s}$ generate a quadrupole field for deflection of the atom beam in the x- and y-directions which is adjustable in strength and azimuthal position.

The component currents proportional to $I_{3s}$ generate a six-pole field fixed in azimuthal position by means of which the particle beam can be focused in one section and defocused in the other section.

Figure 3B:
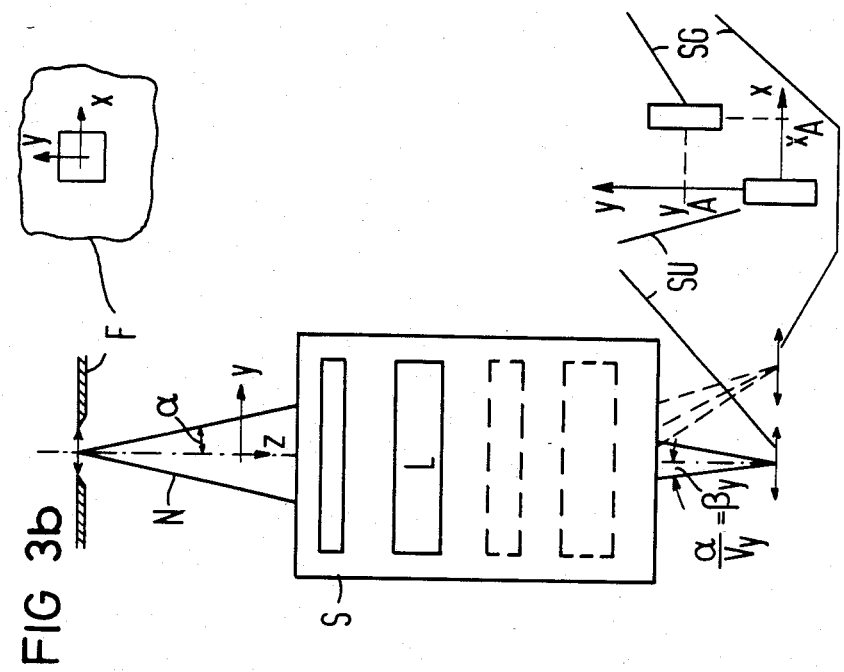
FIG. 3b is a view of the beam deflection lens shown in FIG. 3a in the y-z plane.
Figure 3A:
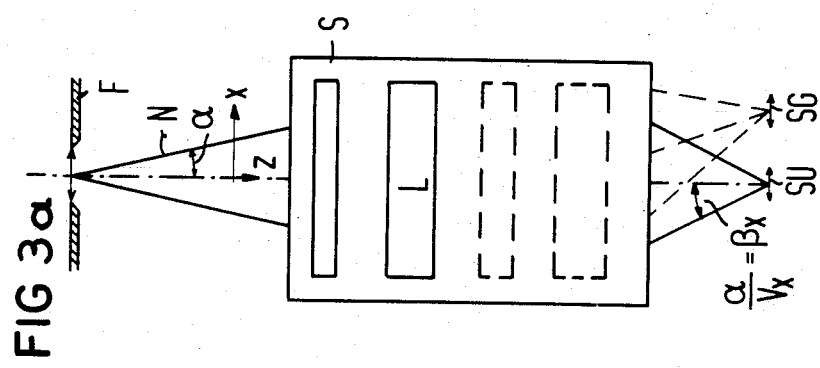
FIG. 3a is a view in the x-z plane of a beam deflection lens constructed in accordance with the principles of the present invention.

A schematic representation for a vario-shaped beam deflection lens for neutral particles is shown in FIG. 3a and FIG. 3b. FIG. 3a shows a section in the x-z plane and FIG. 3b shows a section in the y-z plane. A neutral particle beam N traverses a beam diaphragm F and is caused thereby to expand conically in the z-direction exhibiting an angle $\alpha$. The neutral particle beam N then traverses a system S consisting of at least two lenses L, which may be six-pole lenses as shown in FIG. 1 or eight-pole lenses as shown in FIG. 2. As indicated by the dashed lines, the system S may be comprised of three such lenses or four such lenses as well without departing from the inventive concept disclosed and claimed herein.

The nondeflected shaped particle beam probe SU is conically focused on a subject, such as a workpiece. The angles of this cone in the two sections are $\beta_x$ and $\beta_y$ respectively. The two primary enlargements $V_x$ and $V_y$ are also indicated according to the relationships $V_x = \alpha/\beta_x$ and $V_y = \alpha/\beta_y$. The deflected shaped beam probe SG can exhibit any designed deflection coordinates $x_A$, $y_A$.

Although modifications and changes may be suggested by those skilled in the art, it is the intention of the inventor to embody within the patent warranted hereon all changes and modifications as reasonably and properly come within the scope of his contribution to the art.

I claim as my invention:

1. An apparatus having a lens system for generating a shaped beam of neutral particles with variable beam cross-section, said lens system comprising a plurality of magnetic multipole lenses disposed sequentially in the radiation propagation direction, each multipole lens having a plurality of pole shoes disposed about a central axis with excitation windings generating at least one dipole field for aligning the magnetic dipole moments of the neutral particles, at least one quadrupole field for deflecting the beam of neutral particles, and at least one hexapole field for focusing the beam of neutral particles in the lens system.

2. An apparatus as claimed in claim 1, wherein said multipole lenses are six-pole lenses.

3. An apparatus as claimed in claim 1, wherein said multipole lenses are eight-pole lenses.

4. An apparatus as claimed in claim 1, wherein said lens system exhibits stigmatic imaging.

5. An apparatus as claimed in claim 1, wherein said multipole lenses are two magnetic lenses.

6. An apparatus as claimed in claim 1, wherein said multipole lenses are three magnetic lenses.

7. An apparatus as claimed in claim 1, wherein said multipole lenses are four magnetic lenses.

8. An apparatus as claimed in claim 1 further comprising a beam diaphragm disposed in front of said beam lens system in the z-direction of travel of said neutral particle beam.

* * * * *